United States Patent [19]
Brownell et al.

[11] Patent Number: 5,299,956
[45] Date of Patent: Apr. 5, 1994

[54] LOW CROSS TALK ELECTRICAL CONNECTOR SYSTEM

[75] Inventors: Kenneth W. Brownell; Sterling A. Vaden, both of Marion, N.C.

[73] Assignee: Superior Modular Products, Inc., Swannanoa, N.C.

[21] Appl. No.: 855,893

[22] Filed: Mar. 23, 1992

[51] Int. Cl.$^5$ .............................................. H01R 13/00
[52] U.S. Cl. ..................................... 439/638; 439/676
[58] Field of Search ......................... 439/492, 607–610, 439/620, 638–640, 651, 654, 655, 67, 77, 676; 379/332

[56] References Cited

U.S. PATENT DOCUMENTS

| | | | |
|---|---|---|---|
| 4,418,239 | 11/1983 | Larson et al. | 174/34 |
| 4,698,025 | 10/1987 | Silbernagel et al. | 439/79 |
| 4,878,847 | 11/1989 | Rutledge | 439/76 |
| 5,186,647 | 2/1993 | Denkmann et al. | 439/395 |

FOREIGN PATENT DOCUMENTS

| | | | |
|---|---|---|---|
| 0421174A2 | 4/1991 | European Pat. Off. | |
| 0525703A1 | 2/1993 | European Pat. Off. | |
| 0256850 | 11/1986 | Japan | 379/332 |
| 0091987 | 3/1990 | Japan | 439/607 |
| 0268484 | 11/1990 | Japan | 439/607 |
| 2233157 | 1/1991 | United Kingdom | 439/607 |

*Primary Examiner*—Joseph H. McGlynn
*Attorney, Agent, or Firm*—Carter & Schnedler

[57] ABSTRACT

There is provided an apparatus for reducing pair to pair cross talk which arises in electrical connectors due to closely spaced elongated parallel contacts. The cross talk which occurs within the connector is reduced by modifying certain circuit paths either inside or outside of the connector so that each conductor of a first pair which is parallel to and cross talking with an adjacent conductor of a second pair in the connector is relocated adjacent and parallel to the other conductor of the second pair over a predetermined distance. It is preferred that the relocation of the circuit paths occur on a circuit board which is attached to the connector.

20 Claims, 8 Drawing Sheets

Fig_10

LOW CROSS TALK ELECTRICAL CONNECTOR SYSTEM

BACKGROUND OF THE INVENTION

This invention relates to reducing electrical signal interference which arises due to parallel contacts in electrical connectors. More particularly it relates to the partial cancellation of pair to pair interference or cross talk induced into a signal carrying cable pair by FCC type modular jacks and plugs, or other input/output signal connectors.

The Federal Communications Commission has adopted certain architectural standards with respect to electrical connectors utilized in the telecommunication industry so as to provide intermatability. The connectors most commonly utilized are FCC type modular plugs and jacks. The plug is commonly terminated to a plurality of wires which may be connected to a telephone handset or other communications device. The corresponding jack is commonly mounted to a panel or a printed circuit board which in turn is connected to a telecommunications network. A typical FCC jack is described in U.S. Pat. No. 4,648,478.

Figure 1:
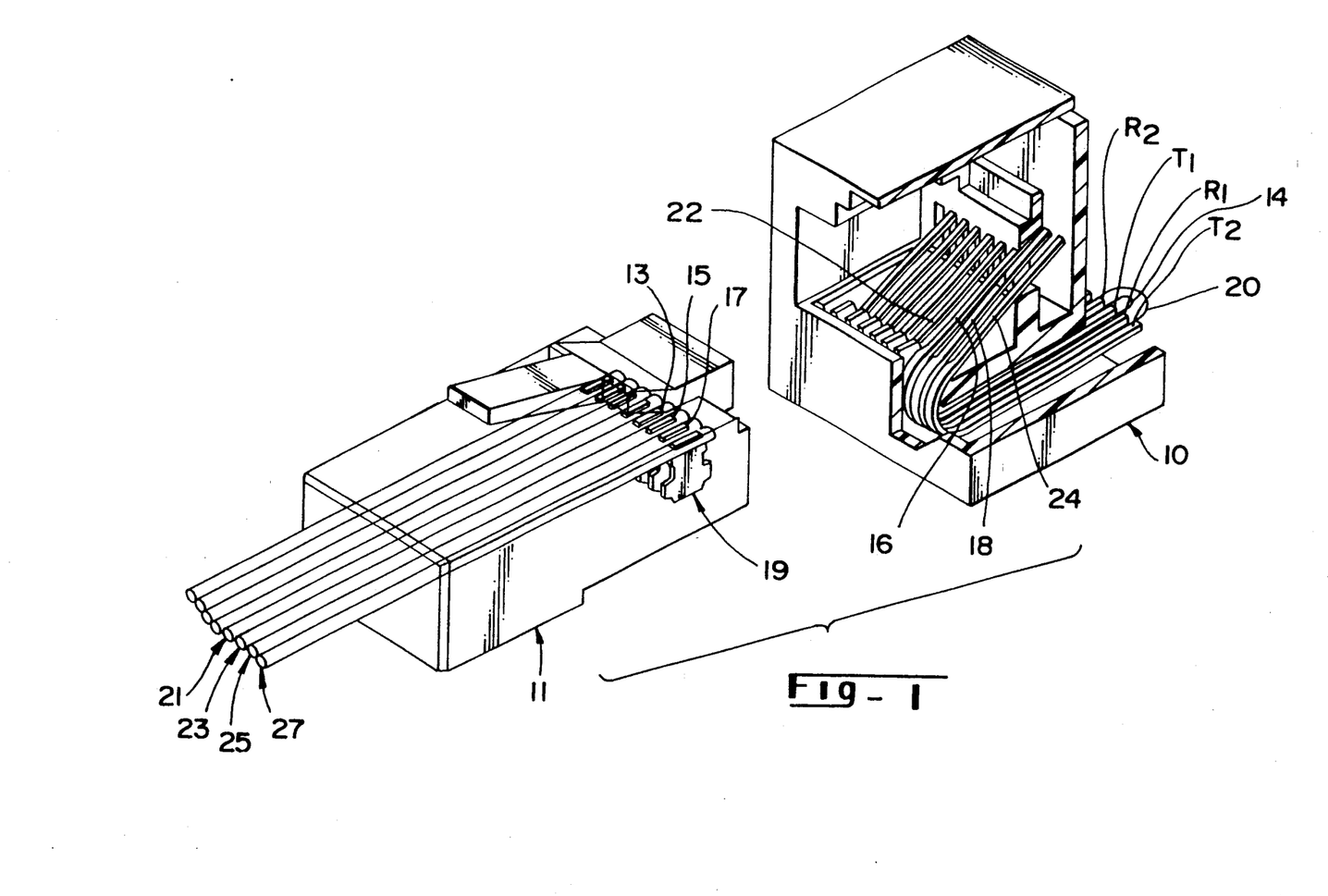
FIG. 1 is a pictorial view showing portions of a typical FCC modular jack and its associated plug and illustrating the contacts.

Often a plurality of jacks, such as six, are placed adjacent to one another in a housing with the printed circuit board forming the backside of the housing. Each jack includes a plurality of elongated contacts which are closely spaced and parallel to one another. A typical jack having four adjacent and parallel contacts is shown in FIG. 1. Jack 10 includes electrical contacts 12 which are housed in the hollow portion of the jack and include two pairs of parallel contacts. Each pair 14 and 20 form separate communication circuits, each of which will be referred to herein sometimes as a signal pair. Pair 14 includes conductor 16 and conductor 18 and pair 20 includes conductor 22 and conductor 24. Each of these contacts extend through the backside 26 of jack 10 and are soldered to circuit board 28. The lengths of the contacts running through the jack are predetermined by connector design considerations.

When an electrical signal of a given frequency is applied to a pair of conductors, unequal portions of signal energy is transmitted to the individual conductors of an adjacent pair by each conductor of the signal pair. This coupling is primarily due to capacitive and inductive coupling between adjacent conductors being substantially higher than the couplings of the other conductor of the signal pair resulting in a phenomenon known as cross talk. This phenomena is further exaggerated when both conductors of the signal pair are placed adjacent to and outside of opposing conductors of the other signal pair. For ease of discussion adjacent conductors which are not a signal pair in themselves are referred to herein as a cross-talking pair. For example conductors 16 and 22 form a cross-talking pair. The extent of the cross talk is governed by such parameters as the space between the adjacent conductors, the dielectric constant of the matter between such conductors and the distance in which such conductors are closely spaced and parallel to one another. Furthermore, the extent of the cross talk is a function of the frequency of the signal on either or both of the signal pairs. Cross talk increases logarithmically as frequency of the signal increases and is commonly expressed as $10 \times \log$ of the ratio of the cross talk energy divided by the signal energy (decibels or dB).

As FCC modular plugs and jacks are utilized more and more in high frequency data and communication applications, cross talk which arises in the adjacent and parallel contacts of the jack, and to a lesser degree in the plug, has become a problem in the industry. Furthermore, because of miniaturization as well as FCC rules, these jacks are quite small resulting in a very close spacing of the contacts which exacerbates the problem.

Figure 4:
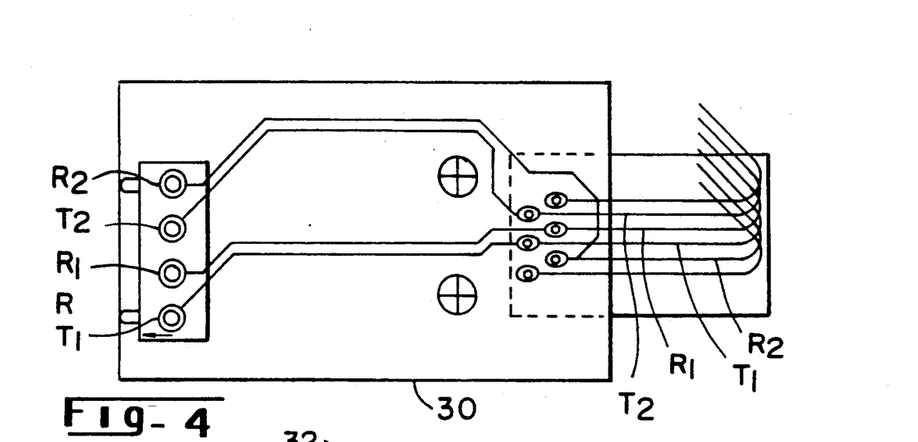
FIG. 4 is a simplified top view of the apparatus of FIG. 2 showing the contacts in the jack and the tracing on the circuit board using prior art design techniques with the circuit board having been rotated 90 degrees for ease of understanding.
Figures 5, 6:
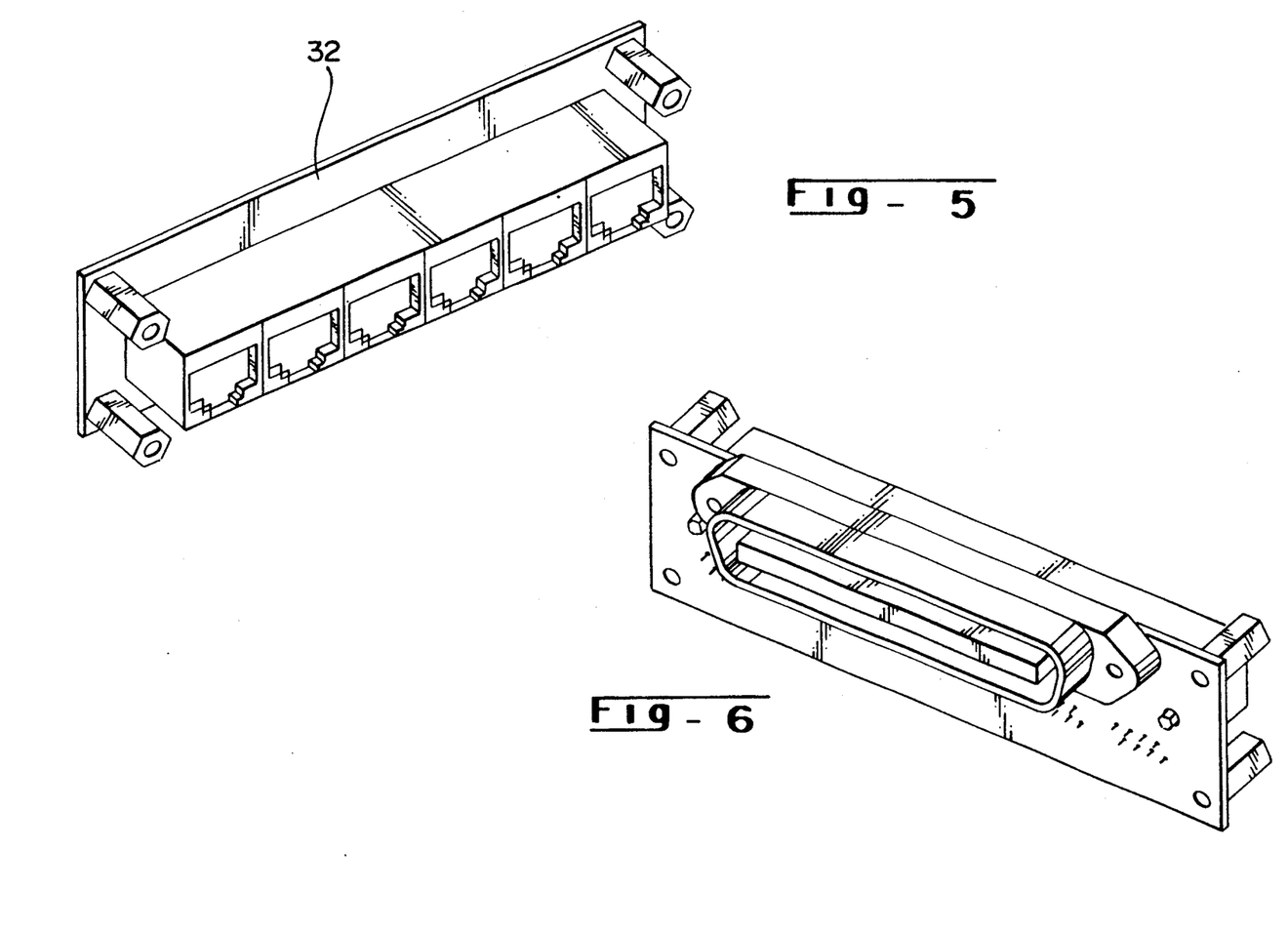
FIG. 5 is a pictorial view of a typical connector having six modular jacks connected thereto in which the invention may be utilized.
FIG. 6 is a pictorial view of the other side of the connector of FIG. 5.

A current industry standard permits no more than $-46$ dB of near end cross talk at 16 Megahertz (MHz). Currently it is anticipated that the standard for near end cross talk will be shortly reduced to less than $-56$ dB. Using good prior art design techniques, such as that shown in FIGS. 3 and 4, one is able to reach $-50$ dB of cross talk at 16 MHz utilizing commonly available modular plug and jack combination. The current thinking is that the routings of the individual circuit paths for each signal pair on the circuit board should generally be parallel to each other and the signal pairs should be separated from one another as much as possible and be non-parallel. That type of design technique on the circuit board does nothing to reduce the cross talk which arises within the connector which is attached to the circuit board but simply, at best, maintains the status quo.

OBJECTS OF THE INVENTION

It is therefore one object of this invention to provide a low cross talk electrical signal transmission system.

It is another object to provide an apparatus for cancelling cross talk which arises within an electrical connector having closely spaced parallel contacts.

It is another object to provide an electrical connector apparatus which is able to equal or exceed pair to pair cross talk standards.

SUMMARY OF THE INVENTION

In accordance with one form of this invention there is provided a low cross talk electrical signal transmission system including an electrical connection apparatus having at least first, second, third and fourth conductors with the first and second conductors forming a first signal pair and the third and fourth conductors forming a second signal pair. The first and second pairs are adjacent and parallel to one another through a major portion of the connector apparatus. The third conductor is adjacent and parallel to the first conductor and the fourth conductor is adjacent and parallel to the second conductor through at least a portion of the connection apparatus forming a first path length thereby inducing cross talk from one signal pair to another signal pair when signals are applied to either one of the said pairs. The third conductor is then routed adjacent to and parallel to the second conductor and away from the first conductor and the fourth conductor is then routed adjacent and parallel to the first conductor and away from the second conductor through another portion of the connector apparatus forming a second path length and thereby cancelling a substantial amount of cross talk which was induced in the first portion of the connector apparatus.

It is preferred that the connector apparatus include a connector housing and a substrate with the first path length being located inside the connector housing and the second path length being located on the substrate. It is further preferred that the substrate be a circuit board.

Quite surprisingly, it has been found that cross talk is substantially reduced when, rather than separating the pairs of conductors on the substrate which would isolate the pairs, the circuit paths of the adjacent conductors of each pair which are parallel and adjacent within the connector and which cause the cross talk are reversed and made parallel to and adjacent to the opposite conductors in a pair preferably for a length similar to the length of the contacts within the connector depending on electrical field strength effects due to geometry of the conductor relationships and dielectric constant of the material surrounding them. This crossing of the conductors results in a cancellation of a substantial portion of the cross talk which was induced within the connector.

The spacing between adjacent conductors on the substrate may be adjusted depending on the differences between the dielectric constants within the connector and the dielectric constants on the substrate and space restrictions on the circuit substrate which may also cause physical path length to be reduced or lengthened.

In another form of this invention where two pairs of signal paths are adjacent to one another for the first path length the positions of two of the conductors of one pair are reversed in the second path length so that cross talk is cancelled.

BRIEF DESCRIPTION OF THE DRAWINGS

The subject matter which is regarded as the invention is set forth in the appended claims. The invention itself, however, together with further objects and advantages thereof may be better understood in reference to the following description taken in conjunction with the accompanying drawings in which:

DESCRIPTION OF THE PREFERRED EMBODIMENTS

Referring now to FIGS. 1 through 15, there is provided modular jack 10 including an array 12 of closely spaced parallel electrical contacts. In this embodiment there are only two signal pairs, namely pair 14 and pair 20. Signal pair 14 includes the central two conductors 16 and 18 of the array and signal pair 20 includes conductors 22 and 24 which flank signal pair 14. Conductors 16 and 18 are also referred to as tip (T) and ring (R) conductors of the signal pair 14 and conductors 22 and 24 form the tip (T) and ring (R) conductors of signal pair 20. For ease of understanding, the entire circuit path which includes contacts, conductors and circuit board tracings are sometimes referred to herein as (T) or (R). Although only two pairs of conductors are shown in FIG. 1 for ease of illustration, often three or four pairs of conductors are provided within the same jack. The associated modular plug having closely spaced and parallel contacts 13, 15, 17 and 19 and conductors 21, 23, 25, and 27 is also shown in FIG. 1. Because of the spacing requirements of the contacts and conductors within the jack and plug, a substantial amount of pair to pair cross talk is introduced. Primarily there is substantial cross talk between conductor 18 and conductor 24 (one cross talking pair) and between conductor 16 and conductor 22, (another cross talking pair). In addition the adjacent contacts and conductors of each signal pair in the plug 11 introduces cross talk.

Figures 2, 3:
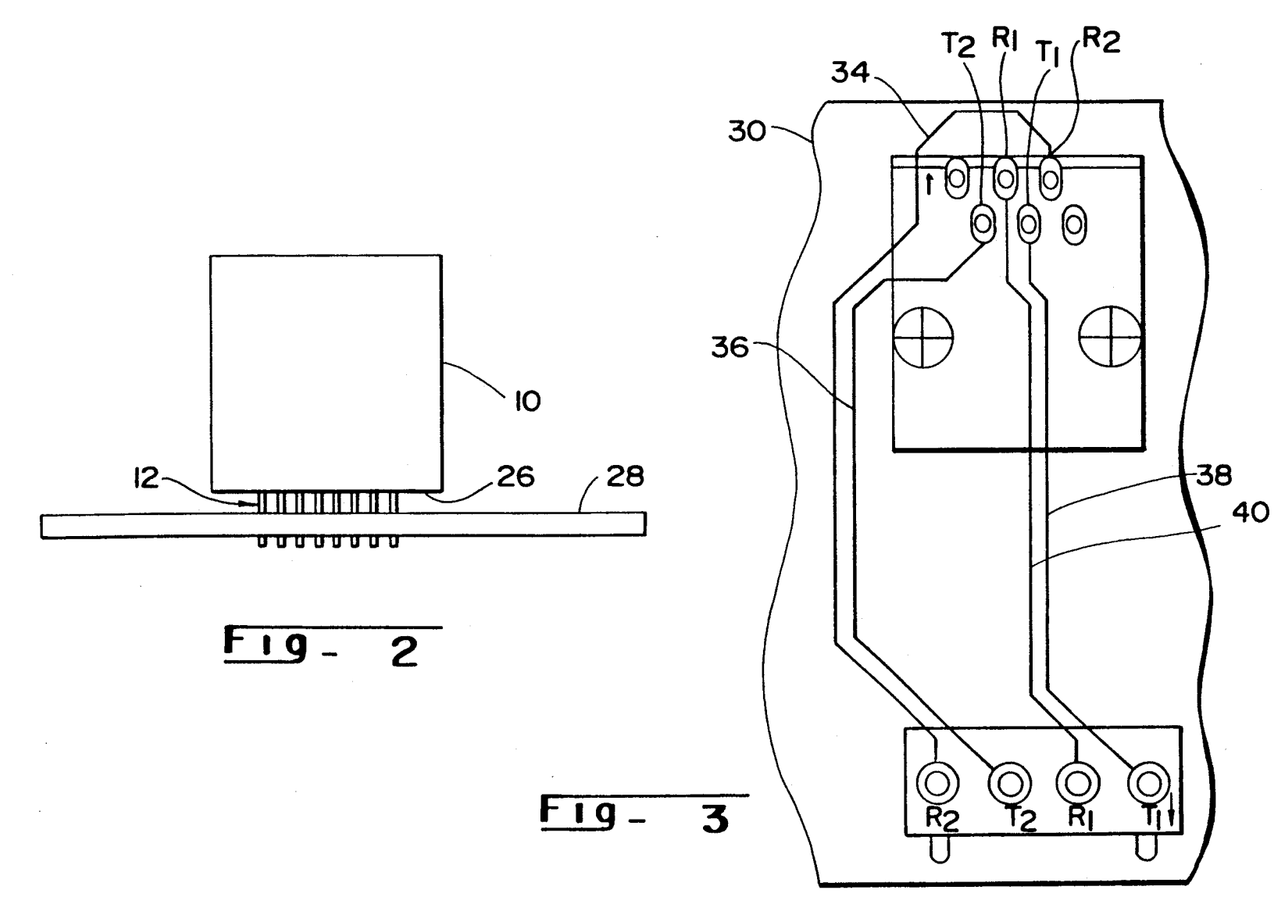
FIG. 2 is a side elevational view of the jack of FIG. 1 showing the jack connected to a circuit board.
FIG. 3 is a side view showing the conductive tracings of a portion of the circuit board of FIG. 2 using prior art design techniques.
Figure 8:
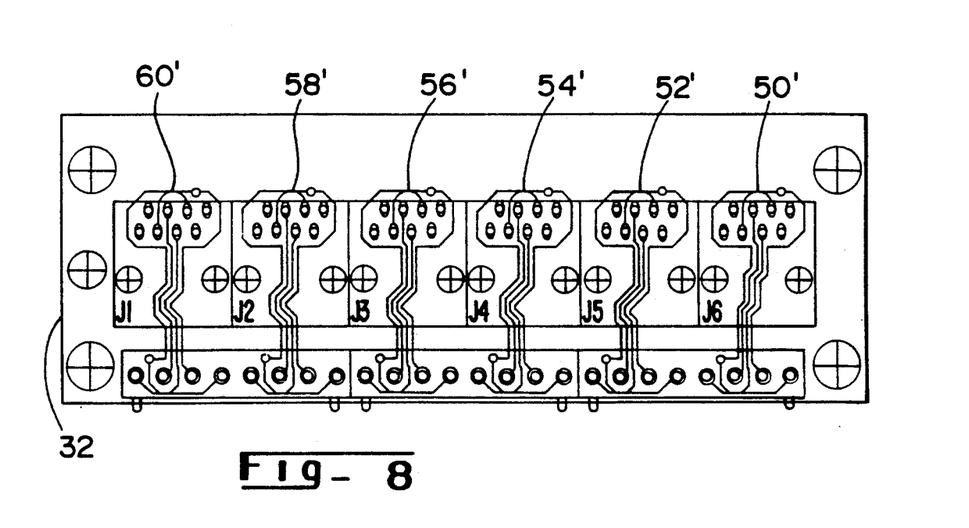
FIG. 8 is a side elevational view of a circuit board illustrating one embodiment of the invention wherein six modular jacks are utilized.

The tails of contacts 12 are soldered to a substrate such as a circuit board 30, in the case of a prior art design as shown in FIG. 3, and to circuit board 32 as shown in FIG. 8 using the design of one embodiment of the present invention. In using the prior art design, it was believed that the tracings on the circuit board, which continues the circuit paths of the contacts, should be structured so that cross talk does not increase beyond what occurred within the connector body. Thus tracing 34 forming part of (R2) was placed adjacent and parallel to tracing 36 (T2), and tracing 38 (T1) and tracing 40 (T2) were placed adjacent and parallel to one another. Thus the two pairs were spaced apart from one another thereby having little if any impact on the cross talk which arose within the connector body.

Figure 10:
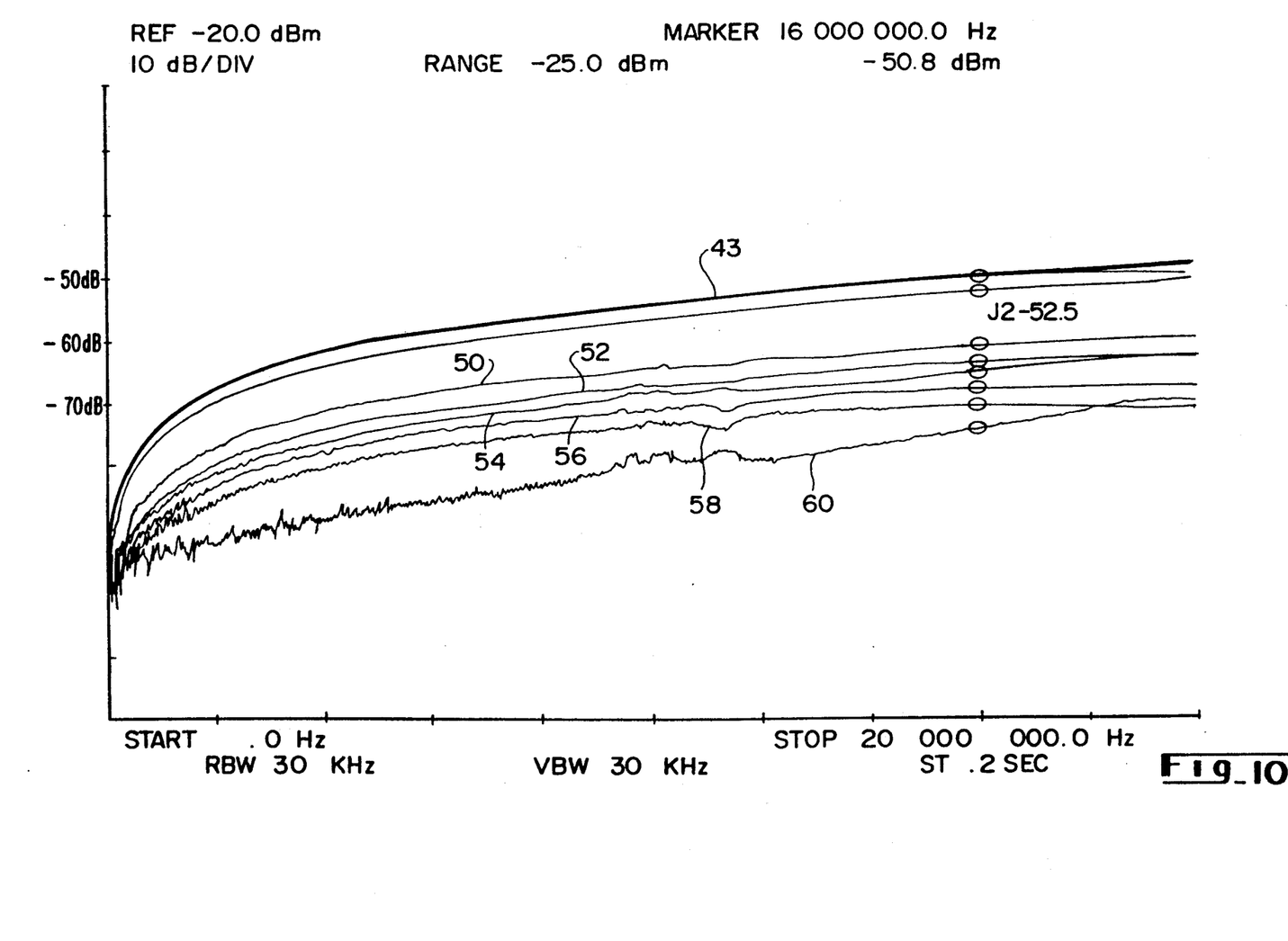
FIG. 10 is a graph comparing near end cross talk readings utilizing the six plugs and tracings shown in FIGS. 5 and 8 as compared to the prior art shown in FIG. 3.

The cross talk characteristics for a typical prior art design as shown in FIG. 3 is illustrated by line 43 in FIG. 10 which shows the cross talk measured in −dB over a range of frequencies. The cross talk was measured by applying a signal on pair 14 and measuring resulting induced portion of the signal on pair 20. At a frequency of 16 MHz's, which is a standard frequency for measuring cross talk, the cross talk was −50 db at 16 MHz's. This level of cross talk is unacceptable for many applications.

Figure 7:
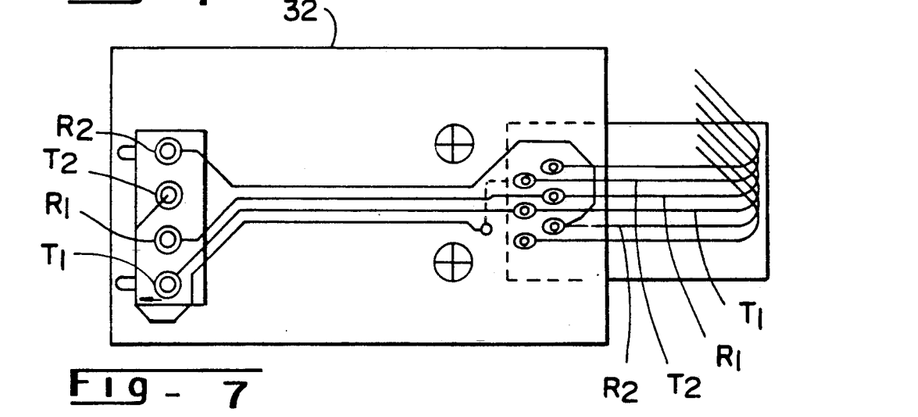
FIG. 7 is a simplified top view of the apparatus of FIG. 2 showing the contacts in the jack and the tracings on the circuit board in accordance with one embodiment of the invention with the circuit board having been rotated 90 degrees for ease of understanding.
Figure 9:
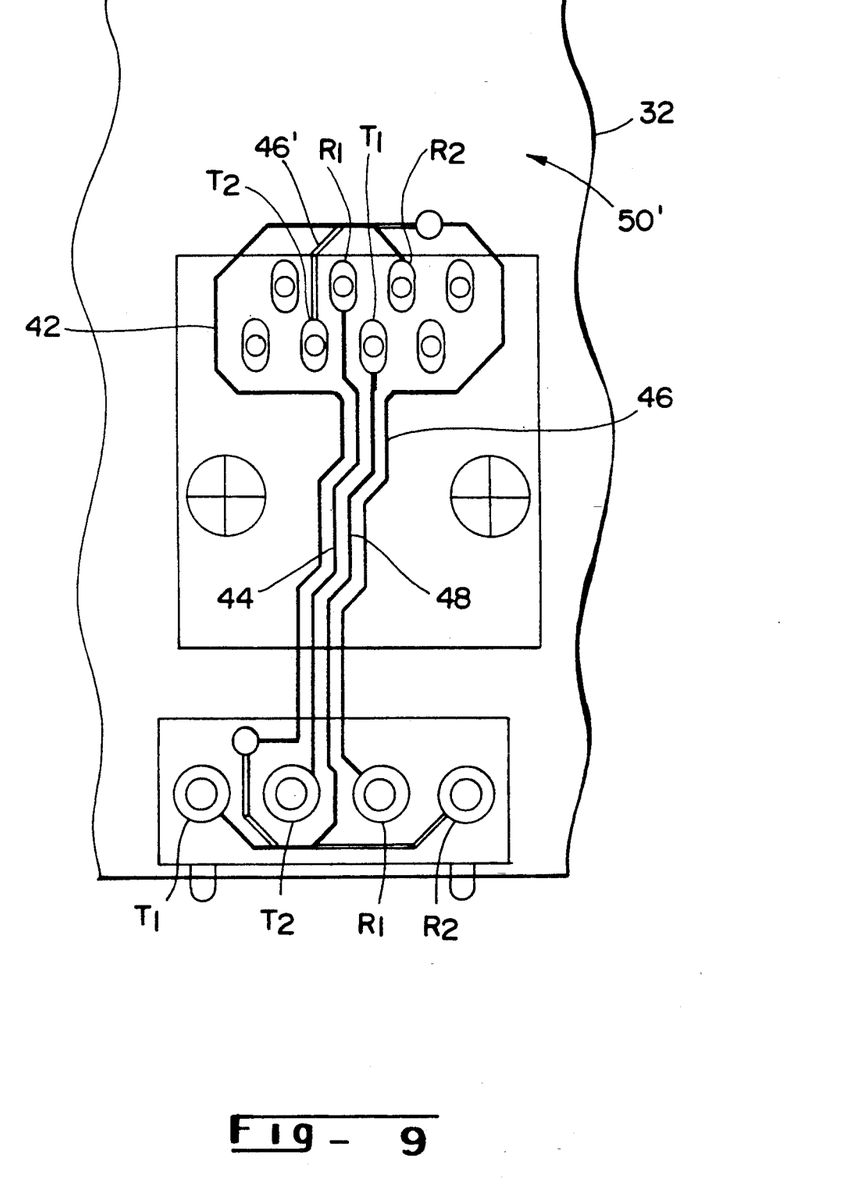
FIG. 9 is a side elevational view of a portion of the circuit board of FIG. 8 but illustrating two adjacent pairs of signal paths.

Applicant has found that the cross talk induced within the plug and jack connectors because of the closely spaced parallel conductors may be substantially reduced by changing the tracings on the circuit board so that rather than isolating the signal pairs, each cross talking conductor path in one signal pair is actually placed adjacent to the opposite conductive path of the other signal pair and the cross talk is substantially cancelled by cross talk energy which is effectively 180 degrees out of phase with the cross talk energy induced by the plug and jack connectors. The conductive paths of one signal pair is referred to in the drawings as T1 and R1 and the second signal pair is referred to as T2 and R2. Inside the connector bodies 10 and 11 $T_1$ is adjacent to R2 (cross talking pair) and T2 is adjacent to R1 (cross talking pair). By placing T2 adjacent to T1 and away from R1, and R2 adjacent to R1 and away from T1 on the circuit board 32 as shown in FIGS. 7 and 9, a substantial amount of the cross talk which occurred within connector bodies is cancelled. This is further illustrated in FIG. 9 where tracing 42 which is R2 runs adjacent to tracing 44 which is R1 and away from tracing 48 which is T1, and tracing 46 which is T2 runs very close to tracing 48 which is T1 and away from tracing 44 which is R1. In FIG. 9, the open line portion 46' of tracing 46 illustrates that a portion is running on the bottom side of the circuit board 32.

Referring now to the graph of FIG. 10, lines 50, 52, 54, 56, 58 and 60 illustrate the improvement in cross talk which is achieved utilizing the circuit board tracing patterns 50', 52', 54' 56' and 60' on circuit board 32 shown in FIG. 8. As can be seen in each of the tracing patterns on circuit board 32, circuit path of T2, which was adjacent to R1 in each connector 10, is placed adjacent to the circuit path T1, and the circuit path of R2, which was adjacent to T1 in each connector, is placed adjacent to the circuit path R1. Thus it can be seen that reductions of cross talk ranging from −10 dB to −25 dB at 16 MHz are achieved utilizing the invention. Since dB is measured in logrithimic terms, each 10 dB reduction results in a ten fold improvement.

Figures 11, 12:
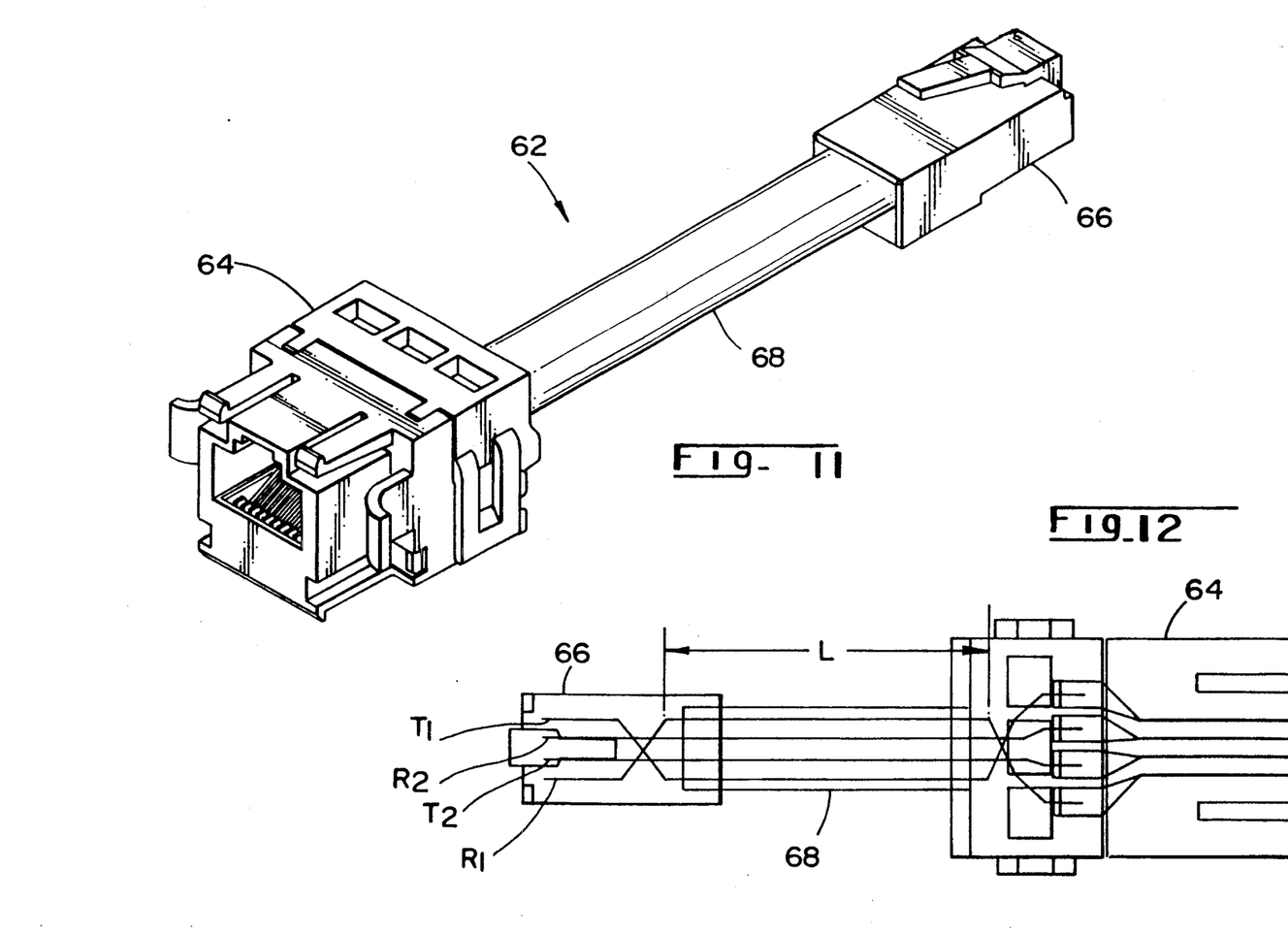
FIG. 11 is a pictorial view showing a jumper which may be used between a jack and a plug for another embodiment of the invention.
FIG. 12 is a top view of FIG. 11, with portions removed, illustrating the configuration of the conductors within the cable portion which provides cross talk reduction.

Referring now more particularly to FIGS. 11 and 12, there is shown an alternative embodiment to the invention. Rather than provide modifications to what was heretofore thought to be proper routing techniques, on a circuit board by reversing and closely spacing the cross talking conductors adjacent to one another, a jumper 62 is provided which includes an FCC modular jack 64 and an FCC modular plug 66. A substrate such as a flat cable is connected between the jack 64 and plug 66. Cable 68 connects the jack 64 to plug 66. Plug 11 is connected to jack 64, and plug 66 is connected to jack 10 thereby forming a jumper between plug 11 and jack 10. In this embodiment the prior art circuit board shown in FIG. 3 would be used with jack 10.

The conductors within cable 68 are illustrated in FIG. 12. Again the portions of the R2 and T2 paths are reversed in the cable so as to cancel the cross talk induced in plugs 11 and 66 and jacks 10 and 64. The length L of the reversed conductors should approximate the lengths of the contacts and conductor in the plugs and jacks, again depending on the dielectric constants and the spacing. It has been found in this embodiment as well as the other embodiments of this invention that by reversing the cross-talking paths a substantial cross talk reduction is achieved. For maximum cross talk cancellation, the length of the jumper and spacing between conductors should be adjusted and held as closely as possible to design dimensions.

Figure 13:
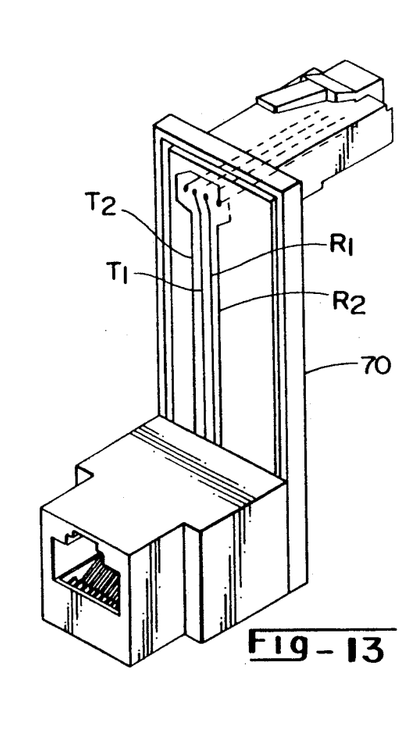
FIG. 13 is a pictorial view of a connector apparatus with portions removed for illustrative purposes showing another embodiment of the invention.

FIG. 13 shows still another embodiment of the invention whereby rather than using a jumper with a cable to reduce cross talk arising in a jack and plug, a connector module 70 is utilized having a substrate such as a circuit board within the module and which utilizes the same crossing of the R2 and T2 paths to effectuate the reduction of cross talk.

The devices of FIGS. 11 and 13 ma be utilized in retrofit applications so that new circuit boards need not be manufactured.

Figure 14:
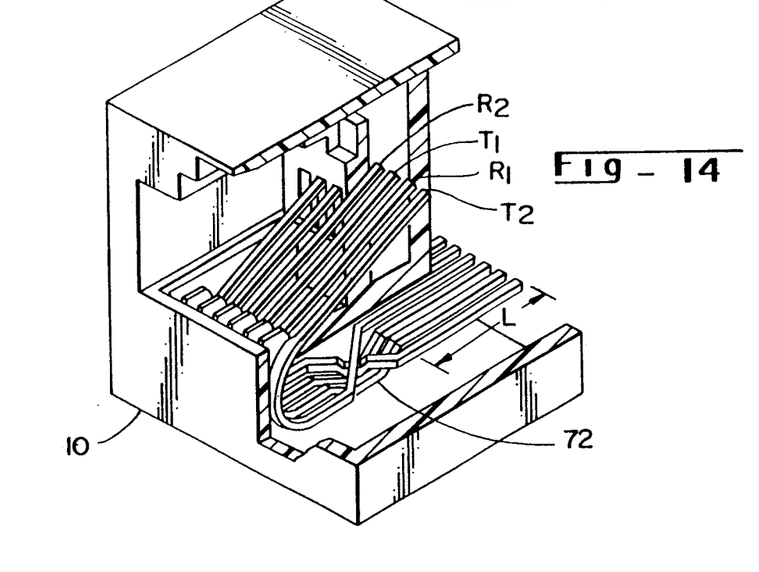
FIG. 14 is a pictorial view showing an array of jack contacts within a jack illustrating yet another embodiment of the invention.

FIG. 14 shows still another embodiment of the invention whereby the conductor array 72 within jack housing 10 is modified by again crossing T2 and R2 paths in the same fashion as shown in FIGS. 7, 12 and 13. In this way, circuit board 28 need not be modified. That is, the prior art circuit board shown in FIG. 3 may be utilized and one may still achieve a cancelling of cross talk which is both induced and cancelled within connector 10.

Figure 15:
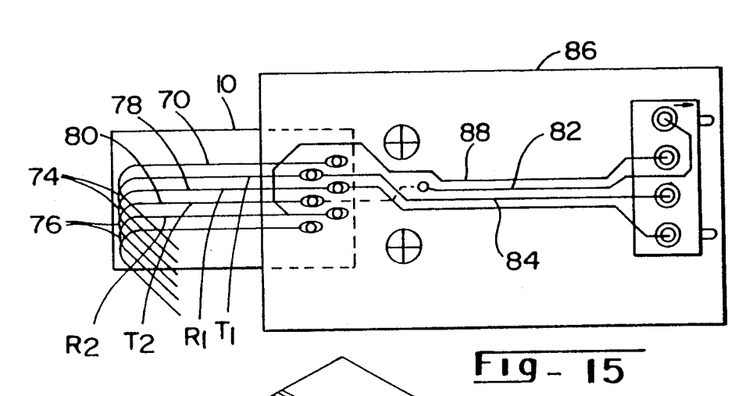
FIG. 15 is a simplified top view showing an alternative embodiment to that of FIG. 7.

FIG. 15 shows yet another embodiment of the invention where each pair of contacts 74 ($T_1$, $R_1$,) and 76 ($T_2$, $R_2$) in connector 10 are adjacent to one another and thus most of the capacitive coupling or cross talk occurs between contact 78 and contact 80. Cross talk reduction is obtained by placing tracing 82 ($T_2$) adjacent to tracing 84 (T1) on circuit board 86 and by placing tracing 88 ($R_2$) away from tracing 84 ($T_2$). In the embodiment of FIG. 15, there is no need to reconfigure the T1, R1 circuit path on the circuit board.

Applicant has thus provided a technique for reducing cross talk arising in FCC type modular jacks and plugs and other signal connectors by taking advantage of the cross talk itself, that is, by reversing the position of the tip (T) and ring (R) conductors in adjacent pairs so that each conductor of a first pair which was originally cross talking with a conductors of the second pair is placed adjacent and parallel to the other conductor of the second pair and away from its original conductor for a certain distance by changing the circuit paths either on a substrate such as a circuit board, in a jumper, or within the housing of the connector itself.

From the foregoing description of the preferred embodiments of the invention, it will be apparent that many modifications may be made therein. It is to be understood that all such modifications are embodied in the accompanying claims which come within the true spirit and scope of this invention.

We claim:

1. A low cross talk electrical signal transmission system comprising:
   an electrical connection apparatus; said electrical connection apparatus including an intermatable connector and a substrate; said intermatable connector including a plug and a jack; said jack attached to said substrate; said intermatable connector and said substrate having at least first, second, third and fourth conductors; said first and second conductors forming a first signal pair; said third and fourth conductors forming a second signal pair; said first and second conductors being adjacent to and parallel to one another through at least a major portion of said electrical intermatable connector; said third conductor being adjacent to and parallel to said first conductor, and said fourth conductor being adjacent to and parallel to said second conductor through at least a portion of said intermatable connector thereby forming a first group of signal paths thus inducing cross talk from one signal pair to another signal pair in said intermatable connector when signals are applied to either of said signal pairs; said third conductor being adjacent to and parallel to said second conductor and said fourth conductor being adjacent to and parallel to said first conductor for at least a portion of said substrate forming a second group of signal paths, thereby cancelling a substantial amount of said cross talk.

2. A system as set forth in claim 1 wherein said substrate is a circuit board.

3. A system as set forth in claim 1 wherein the length of said second group of circuit paths is substantially the same length as said first group of circuit paths.

4. A system as set forth in claim 1 wherein said connector apparatus includes a jumper including a second jack, a plug and a substrate connected between said second jack and said plug.

5. A system as set forth in claim 4 wherein said second substrate is a cable.

6. A system as set forth in claim 4 wherein said second substrate is received within an enclosure; a second jack and a second plug are attached to said enclosure.

7. A low cross talk electrical signal transmission system comprising:
- at least four conductive paths formed by a first pair of conductors and a second pair of conductors; each pair of conductors being a part of a separate electrical circuit each conducting separate electrical signals;
- an intermatable electrical connector including a plug and a jack; first portions of each of said conductive paths being through said connector; said conductive paths being substantially parallel to one another through at least a part of said connector thereby causing pair to pair signal interference when an electrical signal is on at least one of said pairs;
- a substrate; second portions of each of said conductive paths being on said substrate; said substrate connected to said jack;
- a capacitance located on said substrate for reducing the pair to pair signal interference, said capacitance formed by the arrangement of said second portions of said conductive paths on said substrate.

8. A system as set forth in claim 7 wherein said substrate is a circuit board.

9. A system as set forth in claim 7 wherein said substrate is a cable.

10. A system as set forth in claim 7 wherein each pair includes a first and a second conductor; said first conductor of said first pair is adjacent to said second conductor in said second pair, and said second conductor of said first pair is adjacent to said first conductor in said second pair for the length of said conductive paths in said connector; said capacitance formed by said first conductor of said first pair being adjacent to said first conductor of said second pair, and said second conductor of said first pair being adjacent to said second conductor of said second pair for a portion of the length of said conductive paths on said substrate.

11. A low cross talk electrical signal transmission system as set forth in claim 7 wherein said capacitance is said second portions of said conductive paths.

12. An electrical connector system comprising:
- an intermatable connector having at least four parallel adjacent contacts; two of said contacts being inner contacts and forming a first conductive pair; two other contacts adjacent to said inner contacts on the outside thereof forming a second conductive pair; said connector including a jack and a plug;
- a carrier; said jack connected to said carrier; said carrier including at least four conductors; each of said conductors connected to one of said contacts; said first contact of said first pair connected to said first conductor of said first pair; said second contact of said first pair connected to said second conductor of said second pair; said first contact of said second pair adjacent to said first conductor of said second pair; said second contact of said second pair connected to said second conductor of said second pair;
- for a substantial portion of the length of said carrier said first conductor of said second pair being adjacent to said second conductor of said first pair, and said second conductor of said second pair being adjacent to said first conductor of said first pair whereby a substantial amount of pair to pair interference which is generated in said connector is cancelled on said carrier wherein said interference is substantially reduced in said system.

13. A system as set forth in claim 12 wherein said carrier is a circuit board.

14. A system as set forth in claim 12 further including a plug having at least four adjacent contacts and at least four parallel conduction; the length of said conductors on said substantial portion of said carrier being substantially equal to the length of the contacts in said connector and said plug plus the length of said conductors in said plug.

15. A system as set forth in claim 12 wherein said carrier is a cable; a jumper; said cable forming a part of said jumper.

16. A system as set forth in claim 15 wherein said jumper includes a plug connected to said cable; said plug having at least four contacts and at least four parallel conductors; said plug adapted to be removably received in said connector.

17. A system as set forth in claim 16 wherein said jumper includes a second connector connected to said cable on the opposite end from said plug; said second connector having at least four contacts.

18. A system as set forth in claim 17 wherein the length of said conductors on said substantial portion of said carrier being substantially equal to the sum of the length of the contacts in both of said connectors and the length of said conductors in both of said plugs.

19. A low cross talk electrical connector system comprising:
- an intermatable electrical connector having at least two pairs of closely spaced electrical contacts thereby causing pair to pair cross talk when electrical signals are present on at least one of said pairs of said contacts; said connector including a plug and a jack;
- a carrier; said carrier connected to said jack; said carrier including at least four conductors; each of said conductors connected to one of said contacts; said conductors being physically oriented on said carrier for substantially reducing pair to pair cross talk originating in said connector.

20. A system as set forth in claim 19 wherein at least one of said conductors is crossed over at least another of said conductors.

* * * * *

REEXAMINATION CERTIFICATE (2704th)
United States Patent [19]
Brownell et al.

[11] B1 5,299,956
[45] Certificate Issued  Oct. 24, 1995

[54] LOW CROSS TALK ELECTRICAL CONNECTOR SYSTEM

[75] Inventors: Kenneth W. Brownell; Sterling A. Vaden, both of Marion, N.C.

[73] Assignee: Superior Modular Products Incorporated, Swannanoa, N.C.

Reexamination Request:
No. 90/003,480, Jun. 29, 1994

Reexamination Certificate for:
Patent No.: 5,299,956
Issued: Apr. 5, 1994
Appl. No.: 855,893
Filed: Mar. 23, 1992

[51] Int. Cl.⁶ ............................................ H01R 25/00
[52] U.S. Cl. .................... 439/638; 439/676; 439/894.1
[58] Field of Search ........................... 439/676, 894, 439/894.1, 395, 607, 610, 638; 333/260, 261

[56] References Cited

U.S. PATENT DOCUMENTS 3,891,815  6/1975  Hiele .
4,767,338  8/1988  Dennis et al. .

FOREIGN PATENT DOCUMENTS 1382013  1/1975  United Kingdom .

OTHER PUBLICATIONS

"Principles of Electricity Applied to Telephone and Telegraph Work" (Long Lines Department, AT&T 1961), pp. 334–344.

*Primary Examiner*—David Pirlot

[57] ABSTRACT

There is provided an apparatus for reducing pair to pair cross talk which arises in electrical connectors due to closely spaced elongated parallel contacts. The cross talk which occurs within the connector is reduced by modifying certain circuit paths either inside or outside of the connector so that each conductor of a first pair which is parallel to and cross talking with an adjacent conductor of a second pair in the connector is relocated adjacent and parallel to the other conductor of the second pair over a predetermined distance. It is preferred that the relocation of the circuit paths occur on a circuit board which is attached to the connector.

REEXAMINATION CERTIFICATE ISSUED UNDER 35 U.S.C. 307 THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–11 is confirmed.

Claims 12 and 19 are determined to be patentable as amended.

Claims 13–18 and 20, dependent on an amended claim, are determined to be patentable.

New claim 21 is added and determined to be patentable.

12. An electrical connector system comprising:
   an intermatable connector having at least four parallel adjacent contracts; two of said contacts being inner contacts and forming a first conductive pair; two other contacts adjacent to said inner contacts on the outside thereof forming a second conductive pair; said connector including a jack and a plug;
   a carrier; said jack connected to said carrier; said carrier including at leasty four conductors; each of said conductors connected to one of said contacts; said first contact of said first pair connected to said first conductor of said first pair; said second contact of said first pair connected to said second conductor of said second pair; said first contact of said second pair [adjacent] *connected* to said first conductor of said second pair; said second contact of said second pair connected to said second conductor of said second pair;
   for a substantial portion of the length of said carrier said first conductor of said second pair being adjacent to said second conductor of said first pair, and said second conductor of said second pair being adjacent to said first conductor of said first pair whereby a substantial amount of pair to pair interference which is generated in said connector is cancelled on said carrier wherein said interference is substantially reduced in said system.

19. A low cross talk electrical connector system comprising:
   an intermatable electrical connector having at least two pairs of closely spaced electrical contacts thereby causing pair to pair cross talk when electrical signals are present on at least one of said pairs of said contacts; said connector including a plug and a jack;
   a carrier; said carrier connected to said jack; said carrier including at least four conductors; each of said conductors connected to one of said contacts; said conductors being physically oriented on said carrier *creating electrical signal couplings on said carrier* for substantially reducing pair to pair cross talk originating in said connector.

*21. A low cross talk electrical signal transmission system comprising:*
   *an electrical connection apparatus; said electrical connection apparatus including an intermediate connector and a substrate; said intermatable connector including a plug and a jack; said jack attached to said substrate; said intermatable connector and said substrate having at least first, second, third and fourth conductors; said first and second conductors forming a first signal pair; said third and fourth conductors forming a second signal pair; said first and second conductors being adjacent to and parallel to one another through at least a major portion of said electrical intermatable connector; said third conductor being adjacent to and parallel to said first conductor, and said fourth conductor being adjacent to and parallel to said second conductor through at least a portion of said intermatable connector thereby forming a first group of signal paths thus inducing cross talk from one signal pair to another signal pair in said intermatable connector when signals are applied to either of said signal pairs; said third conductor being adjacent to, parallel to, and physically and electrically in close proximity to said second conductor and said fourth conductor being adjacent to, parallel to, and physically and electrically in close proximity to said first conductor for at least a portion of said substrate forming a second group of signal paths, thereby cancelling a substantial amount of said cross talk.*

\* \* \* \* \*